United States Patent
Larson, III et al.

(10) Patent No.: US 6,215,375 B1
(45) Date of Patent: Apr. 10, 2001

(54) BULK ACOUSTIC WAVE RESONATOR WITH IMPROVED LATERAL MODE SUPPRESSION

(75) Inventors: John D. Larson, III, Palo Alto; Richard C. Ruby, Menlo Park; Paul Bradley, Mountain View, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/282,082

(22) Filed: Mar. 30, 1999

(51) Int. Cl.$^7$ .................................. H03H 9/17; H03H 9/54
(52) U.S. Cl. ............................ 333/187; 310/365; 310/321
(58) Field of Search .................................. 333/186–192; 310/320–324, 349, 351, 353, 365, 366, 334, 335, 311

(56) References Cited

U.S. PATENT DOCUMENTS

| | | | |
|---|---|---|---|
| 4,066,986 | * 1/1978 | Takano et al. | 333/188 |
| 4,123,680 | * 10/1978 | Kemper et al. | 333/187 X |
| 4,760,358 | * 7/1988 | Inoue | 333/187 |
| 5,162,691 | * 11/1992 | Mariani et al. | 310/321 |
| 5,185,589 | * 2/1993 | Krishnaswamy et al. | 333/191 X |
| 5,274,297 | * 12/1993 | Hermann et al. | 310/365 X |
| 5,455,475 | * 10/1995 | Josse et al. | 310/322 X |
| 5,578,974 | * 11/1996 | Yang et al. | 310/365 X |
| 5,884,378 | * 3/1999 | Dydyk | 310/311 X |
| 5,903,087 | * 5/1999 | Mattson et al. | 310/365 |

* cited by examiner

Primary Examiner—Robert Pascal
Assistant Examiner—Barbara Summons

(57) ABSTRACT

A bulk acoustic wave device that provides a high spectral purity, high Q, resonator in the radio frequency and microwave frequency ranges. Such resonators may be coupled together to form filters or other frequency selective devices. The bulk acoustical wave filter is constructed from a piezoelectric (PZ) material having a first surface and a second surface and first and second electrodes. The first electrode includes an electrically conducting layer on the first surface, and the second electrode includes an electrically conducting layer on the second surface. The first electrode overlies at least a portion of the second electrode, the portion of the first electrode that overlies the second electrode has a periphery which is a non-rectangular, irregular polygon. In the preferred embodiment of the present invention, the periphery is a three-sided, four-sided, or n-sided irregular polygon in which no two sides are parallel to one another.

7 Claims, 3 Drawing Sheets

BULK ACOUSTIC WAVE RESONATOR WITH IMPROVED LATERAL MODE SUPPRESSION

FIELD OF THE INVENTION

The present invention relates to acoustic resonators, and more particularly, to acoustic resonators that may be used as filters for electronic circuits.

BACKGROUND OF THE INVENTION

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves can propagate longitudinally in the same direction as the electric field and reflect off the electrode/air interface, or in a direction transverse to the electric field and reflect off the various discontinuities at the edges of the electrodes or the structure.

The device is a mechanical resonator which can be electronically coupled; hence, the device can act as a filter. For a given phase velocity of sound in the material, the mechanical resonant frequency is that for which the half wavelength of the sound wave propagating longitudinally in the device is equal to the total thickness of the device. Since the velocity of sound is four orders of magnitude smaller than the velocity of light, the resulting resonator can be quite compact. Resonators for applications in the GHz range may be constructed with physical dimensions less than 100 microns in diameter and a few microns in thickness.

At the heart of Thin Film Bulk Acoustic Resonators (FBARs) and Stacked Thin Film Bulk Wave Acoustic Resonators and Filters (SBARs) is a thin sputtered piezoelectric film having a thickness on the order of one to two microns. Electrodes on top and bottom sandwich the piezoelectric film to provide an electric field through the piezoelectric material. The piezoelectric material, in turn, converts a fraction of the electric field into a mechanical field. An FBAR is a single layer of PZ material and acts as an absorption filter. An SBAR is constructed by stacking two or more layers of PZ material with electrodes between the layers and on the top and bottom of the stack. An SBAR is typically used for a transmission filter.

To simplify the following discussion, the present invention will be explained in terms of an FBAR; however, it will be apparent from the discussion that the teachings of the present invention are also applicable to SBARs as well. The portion of the PZ film included between the electrode overlap forms an acoustical cavity. The primary oscillatory mode of this cavity is that in which sound waves, either compression, shear, or of plate wave type, propagate in a direction perpendicular to the plane of the electrodes. Unfortunately, there are other oscillatory modes that can be excited. These modes correspond to sound waves travelling parallel to the plane of the electrodes and bouncing off the walls of the cavity or the discontinuity at the edge of the electrode layers. The primary frequency of these modes is much lower than the primary mode, however, the higher harmonics of these transverse modes can appear within the frequency band of the primary mode. These harmonics lead to a number of "spikes" or other irregularities in the absorption spectrum of the FBAR. While the total energy absorbed by these spikes is relatively small, the irregularities can still cause problems in circuits employing filters of the FBAR and SBAR variety.

Broadly, it is the object of the present invention to provide an improved bulk acoustical resonator.

It is a further object of the present invention to provide a bulk acoustical resonator that has an absorption and/or transmission spectrum that does not include irregularities generated by transverse resonant modes.

These and other objects of the present invention will become apparent to those skilled in the art from the following detailed description of the invention and the accompanying drawings.

SUMMARY OF THE INVENTION

The present invention is a bulk acoustical wave filter that is constructed from a piezoelectric (PZ) sheet having a first surface and a second surface and first and second electrodes. The first electrode includes an electrically conducting layer on the first surface, and the second electrode includes an electrically conducting layer on the second surface. The first electrode overlies at least a portion of the second electrode, the portion of the first electrode that overlies the second electrode determines the electric field distribution. The resulting planar shape of electric field is designed to have a periphery which is a non-rectangular, irregular polygon. In the preferred embodiment of the present invention, the periphery is a quadrilateral shape in which no two sides are parallel to one another.

DETAILED DESCRIPTION OF THE INVENTION

Figure 1:
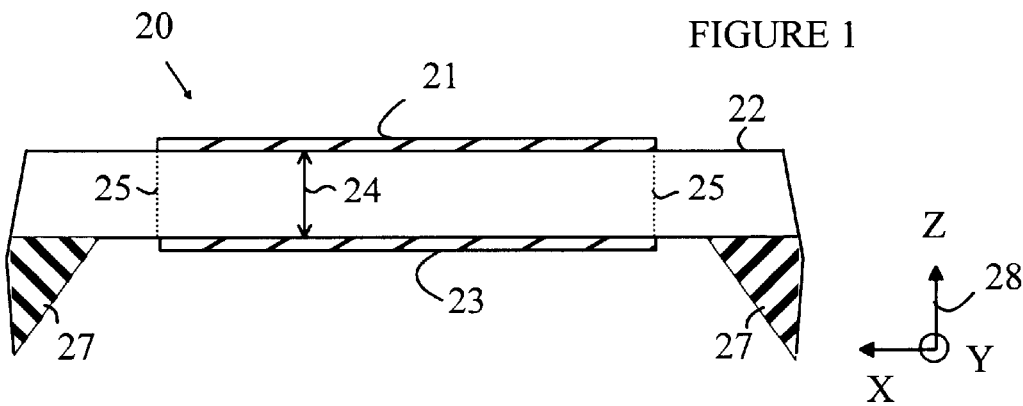
FIG. 1 is a cross-section of FBAR resonator.
Figure 2:
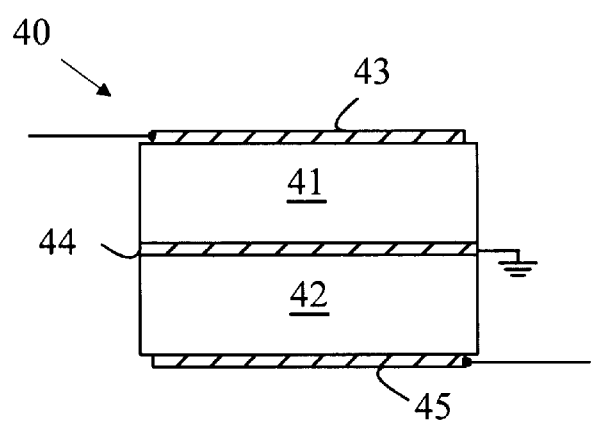
FIG. 2 is a cross-section of an SBAR resonator.

The present invention may be more easily understood with reference to FIGS. 1 and 2, which are cross-sectional views of an FBAR and an SBAR, respectively. Referring to FIG. 1, FBAR 20 includes bottom and top electrodes 23 and 21, respectively, which sandwich a portion of a sheet of piezoelectric (PZ) material 22. The PZ sheet 22 is suspended over a cavity to provide an air/electrode interface on the bottom of the FBAR. The cavity is typically created by etching away a portion of a support layer 27. The preferred PZ material is aluminum nitride, A/N. The electrodes used in resonator 20 are preferably made of molybdenum; however, embodiments employing other materials may also be constructed. Coordinate system 28 is oriented such that the z-axis corresponds to longitudinally directed waves of any mode type, while the x or y axes refer to transversely directed waves, again of type compression, shear, or plate mode.

Figure 3A:
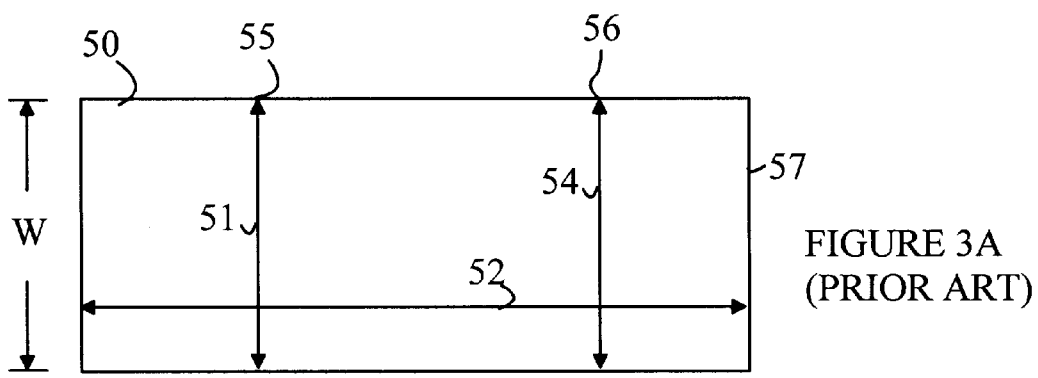
FIG. 3A is a top view of an FBAR acoustical cavity in a typical prior art FBAR, in which the top and bottom electrodes form a rectangular overlap region.
Figure 3B:
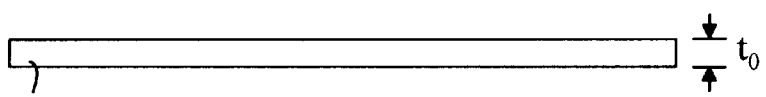
FIG. 3B is a side view of the FBAR acoustical cavity shown in FIG. 3A.

These devices are designed to use bulk compression or shear acoustic waves propagating in a direction parallel to the z-axis in the thin film PZ material as the desired resonator mode. When an electric field is created between the two electrodes via an impressed voltage, the PZ material converts some of the electrical energy into mechanical energy in the form of sound waves. The sound waves propagate in the same direction as the electric field as shown at 24 and reflect off the electrode/air interface. Referring to FIGS. 3A–B, the primary longitudinal resonance mode of the cavity is centered at $c_L/(2t_o)$, where $c_L$ is the speed of sound of the longitudinally propagating mode, $t_o$ is the thickness of the PZ layer.

At the mechanical resonance, the device appears to be an electronic resonator; hence, the device can act as a notch filter. The mechanical resonant frequency is the frequency for which the half wavelength of the sound waves propagating in the device is equal to the total thickness of the device for a given composite phase velocity of sound in the material. Since the velocity of sound is four orders of magnitude smaller than the velocity of light, the resulting resonator can be quite compact. Resonators for applications in the GHz range may be constructed with physical dimensions of the order of 100 $\mu$m across and a few $\mu$m in thickness.

Refer now to FIG. 2, which is a cross-sectional view of an SBAR 40. An SBAR provides electrical functions analogous to those of a band-pass filter. SBAR 40 is basically two FBAR filters that are mechanically coupled. The cavity under the bottom layer of PZ material has been omitted from this drawing. A signal across electrodes 43 and 44 at the resonance frequency of PZ layer 41 will transmit acoustical energy to PZ layer 42. The mechanical oscillations in PZ layer 42 are converted to an electrical signal across electrodes 44 and 45 by the PZ material.

Referring again to FIG. 1. When a potential is applied across the electrodes in the z-direction to generate the desired wave type, a transversely directed mechanical strain may be generated either through the piezoelectric component $d_{31}$ coupling (see J. F. Nye, *Physical Properties of Crystals*, Oxford Press, 1957, pg. 143), or through Poisson ratio coupling (see J. F. Nye, pg. 143) which can excite sound waves travelling laterally within the PZ layer. These waves are predominantly reflected by the abrupt change in density at the edge of the electrodes as shown at 25, but may also be reflected by the cavity edges or the PZ sheet edges. The PZ layer under the electrodes may be viewed as an acoustical cavity even though the PZ sheet is much larger than the electrodes. This cavity can have a number of resonant modes, which correspond to sound propagation paths in which sound waves travelling parallel to the plane of the electrodes bounce off the walls or electrode edges a number of times and finally return to the same point on the wall of the cavity.

Refer again to FIG. 3A, which is a top view of an FBAR acoustical cavity 50 in a typical prior art FBAR, in which the top and bottom electrodes are rectangular. For any point on the periphery of cavity 50, a transverse mode will correspond to a sound path that leaves that point and then returns to the same point after bouncing off one or more walls of the cavity. For example, sound waves leaving point 55 can bounce off the parallel wall opposite to point 55 and return to point 55 along path 51. This transverse mode corresponds to a harmonic series of absorption bands in the absorption spectrum of the FBAR. These bands will have frequencies centered at $c_T N/(2W)$, where $c_T$ is the speed of the transversely propagating sound wave in the PZ medium, W is the width of the FBAR, and N=1, 2, . . . . The primary longitudinal resonance mode of the cavity is centered at $c_L/(2t_o)$, where $c_L$ is the speed of sound of the longitudinally propagating mode, $t_o$ is the thickness of the PZ layer. Hence, if W/N is approximately equal to $t_o*(c_T/c_L)$ for some N, the transverse mode will introduce a spike or spikes into the frequency spectrum of the FBAR within the frequency range of interest. The magnitude of the spike(s) will depend on N and on the number of other points on the periphery of the cavity which can give rise to transverse modes with the same resonant frequency. In general, the coupling coefficient to a given parasitic lateral mode will decrease with N and increase with the number of points having the same resonant frequency.

If two points on the periphery have transverse modes that have the same frequency, the transverse mode is said to be degenerate. The amplitude of the spike introduced into the spectrum at the transverse mode frequency will be increased by the number of such points that have this resonant path length. Referring again to FIG. 3, it will be seen that all points along the wall in which point 55 is located will have a resonant path of length 2W corresponding to sound waves leaving that point and bouncing off the opposite parallel wall. For example, sound waves leaving point 56 will have a transverse mode path 54, which is also of length 2W. This high level of degeneracy results in a series of significant peaks in the absorption spectrum at the above-described spacings. A similar problem exists for paths on wall 57 such as path 52.

The present invention is based on the observations that the absorption anomalies caused by the transverse modes would be substantially reduced if each point on the periphery of the cavity had a transverse mode that differed from every other point on the periphery and if the corresponding path lengths were large compared to the physical dimensions of the FBAR. In this case, the portion of the absorption spectrum generated by the transverse modes would be essentially constant over the frequency range of interest, and hence, would not introduce anomalies into the absorption band of interest.

In principle, the path lengths can be increased by increasing the size of the resonator. However, other considerations limit the size of the resonator, and hence, this method of increasing N is not available. For example, the size of the resonator determines its electrical impedance at the desired filter frequency. Since the impedance is set by the electrical parameters of the circuit in which the resonator is to function, the designer is not free to set the size. In addition, economic considerations favor smaller resonators. As will be discussed in detail below, the present invention provides a means for increasing the path lengths without substantially increasing the size of the resonator.

In general, it is to be understood that the suppression of lateral mode resonances described above is achieved by shaping the acoustic cavity and support structure of the resonator. Such shaping can be achieved by 1) shaping the overlap region of the resonator electrodes, 2) shaping the etched out cavity region, 3) shaping the PZ region edges, 4) using differing metals in the electrode structure. Other forms of irregular shaped acoustic resonator structures capable of suppressing the lateral mode resonances may also be utilized without departing from the teachings of the present invention.

Figure 4:
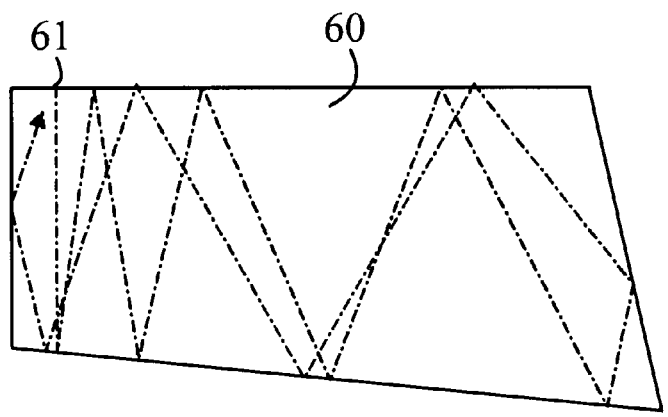
FIG. 4 is a top view of an FBAR acoustical cavity according to the present invention in which the electrode overlap region forms an irregular figure.

The manner in which the present invention reduces the degeneracy of the transverse modes may be more easily understood with reference to FIG. 4 which is a top view of an FBAR acoustical cavity 60 according to the present invention. Cavity 60 differs from cavity 50 shown in FIG. 3 in that opposite walls of the cavity are no longer parallel. Hence, a sound wave leaving a point on one wall will not be reflected by the opposite wall back onto the same point from which the wave left. In general, the path from any given point back to the vicinity of that point is much longer than dimensions of the FBAR as illustrated by the path leaving point 61. Designs in which the effective path lengths are 10 times the maximum dimension of the cavity are easily obtained. Furthermore, different points on the periphery will have path lengths that are different from their neighboring points, and hence, the degeneracy that resulted in absorption spectrum spikes in the prior art cavities are substantially reduced. In addition, it should be noted that the paths do not quite close on themselves. That is, the sound waves only return to a point close to the point at which they started. As a result, the corresponding absorption peaks are broader than those obtained with the prior art devices. Accordingly, the parasitic transverse mode spectrum is transformed from separate sharp peaks to a much larger number of broad peaks that overlap one another to form a more or less continuous background that lacks spikes that could interfere with the characteristics of the FBAR in the region of interest.

Figure 5:
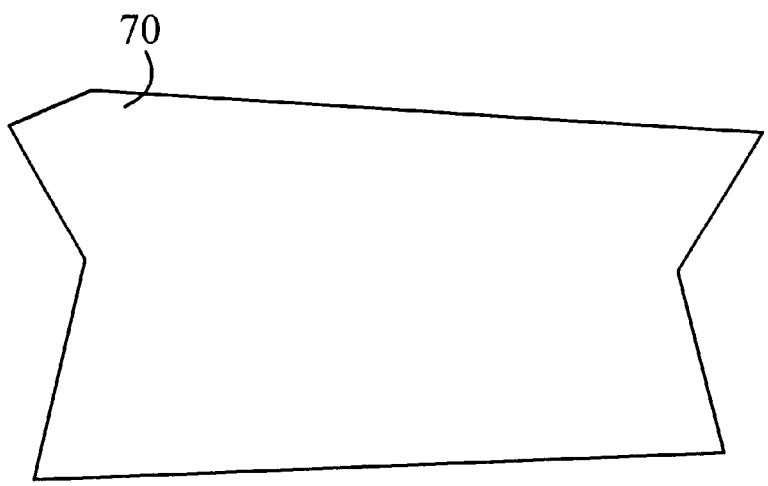
FIG. 5 is a top view of another embodiment of an FBAR acoustical cavity according to the present invention.

As noted above, the electrode overlap determines the shape of the underlying cavity. Accordingly, it is sufficient to adjust the shape and overlap of the electrodes to suppress transversely propagating waves. If the periphery of the electrode is defined by straight-line segments, i.e., a polygon, no two segments should be parallel to each other in the ideal case. A compact irregular polygon can, in general, be found that will satisfy this constraint. The cavity shown in FIG. 4 is such a cavity. Another embodiment of a irregular polygon shaped electrode is shown in FIG. 5 at 70. It should be noted that regular polygons with odd numbers of sides satisfy the above constraint but still exhibit strong degenerate transverse modes. Accordingly, irregular polygons are preferred. In the preferred embodiment of the present invention, a four sided polygon in which no two sides are parallel is utilized.

Figure 6:
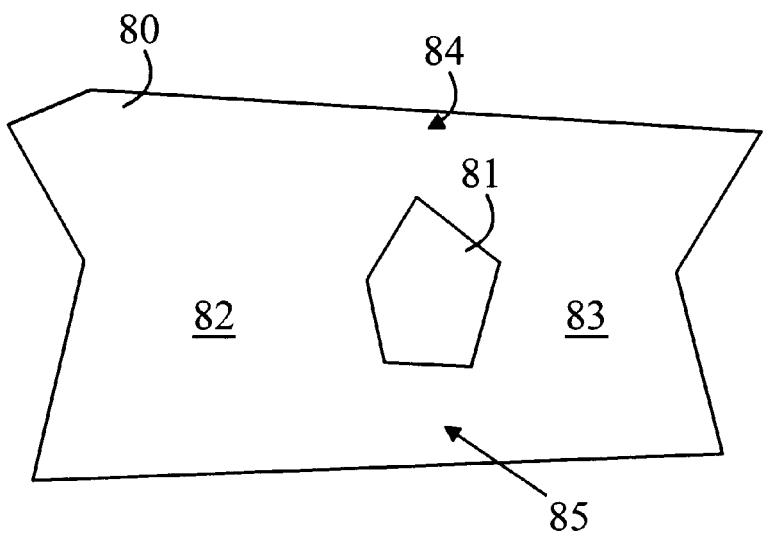
FIG. 6 is a top view of an electrode having a section removed therefrom.

One may also employ multiply connected domains for the top electrode, as illustrated in FIG. 6 which is a top view of an electrode 80 having a section 81 removed therefrom. The removed section, in effect, divides the electrode into two domains shown at 82 and 83 which are connected regions 84 and 85.

However, it will be obvious to those skilled in the art from the preceding discussion that a boundary in which a small fraction of the boundary contains two linear segments that are opposite to each other and parallel to each other will still be a substantial improvement over the prior art devices in which most, if not all, of the boundary is composed of linear segments with pairs of segments being opposite, and parallel to, one another.

Figure 7:
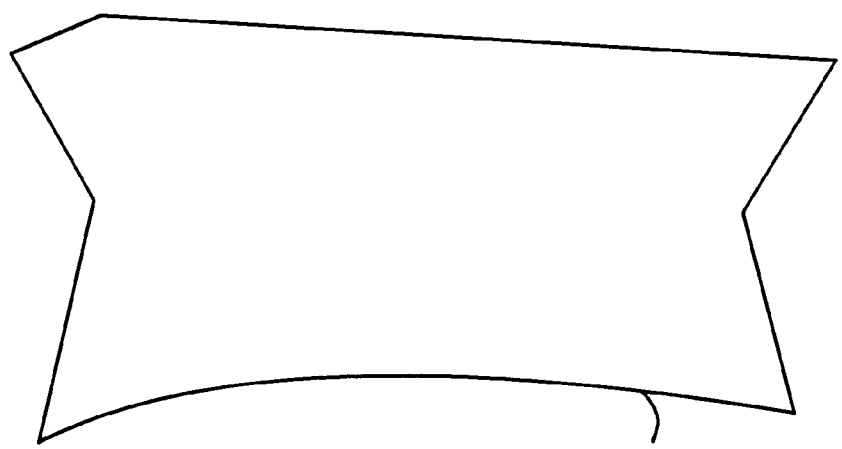
FIG. 7 illustrates an electrode having a curved boundary segment.

While the simplest electrode configurations are polygons, other configurations can be utilized. For example, electrodes having a boundary that includes curved arcs such as shown at 171 in FIG. 7 may also be utilized if such boundaries reduce the amplitude and the frequency of the fundamental transverse modes. For the purposes of the present discussion, a cavity having a curved boundary will be viewed as a polygon with an infinite number of sides. If the polygon is regular, the boundary is a circle. Resonators with circular electrodes can give rise to strong transverse modes. "Whispering gallery" resonators utilize these modes. Therefore, a circular electrode resonator is a poor choice for an FBAR.

The simplest method for measuring the effectiveness of any particular design is to compare the transverse mode absorption spectrum of that design to that obtained with a rectangular electrode. As noted above, the rectangular electrode will result in a cavity having an absorption spectrum that includes a number of distinct peaks in the frequency region in which the filter is to function. Any alteration in the boundary from a rectangle that substantially reduces the amplitudes of these peaks will be an improvement over the prior art FBARs. The present invention preferably reduces these peaks by at least a factor of 10; however, even a factor of two is a significant improvement.

It should be noted that the acoustical cavity is formed in the region of the PZ sheet in which the top electrode overlies the bottom electrode. Often, the electrodes have non-overlying appendages that are used for making electrical connections to the electrodes. These appendages will also be in contact with the PZ sheet. However, it is only the region in which the electrodes overlie one another that becomes the acoustical cavity.

Various modifications to the present invention will become apparent to those skilled in the art from the foregoing description and accompanying drawings. Accordingly, the present invention is to be limited solely by the scope of the following claims.

What is claimed is:

1. A filter for absorbing energy in a frequency band, said filter comprising:
    a PZ sheet having a first surface and a second surface;
    a first electrode comprising an electrically conducting layer on said first surface; and
    a second electrode comprising an electrically conducting layer on said second surface, wherein said first electrode overlies at least a portion of said second electrode, said portion of said second electrode having a periphery chosen such that the amplitude of any transverse mode absorption peak in said frequency band is less than one half the amplitude of any transverse mode absorption peak obtained with a rectangular periphery.

2. The filter of claim 1 wherein said periphery is chosen such that the amplitude of any transverse mode absorption peak in said frequency band is less than one tenth the amplitude of any transverse mode absorption peak obtained with a rectangular periphery.

3. The filter of claim 1 further comprising a structure for supporting said portion of said PZ sheet over a cavity such that said first electrode has an air interface on the side thereof that is not in contact with said PZ.

4. The filter of claim 1 wherein said periphery further comprises a curved segment.

5. The filter of claim 1 wherein said periphery is an irregular polygon in which no two sides are parallel to one another.

6. A filter comprising:

a PZ sheet having a first surface and a second surface;

a first electrode comprising an electrically conducting layer on said first surface; and a second electrode comprising an electrically conducting layer on said second surface, wherein said first electrode overlies at least a portion of said second electrode, said portion of said second electrode having a periphery comprising at least a portion of a non-rectangular, irregular polygon, wherein said first electrode comprises a conducting sheet having a non-conducting region contained therein, and wherein said periphery is chosen such that the amplitude of any transverse mode absorption peak in said frequency band is less than one half the amplitude of any transverse mode absorption peak obtained with a rectangular periphery.

7. A filter comprising:

a PZ sheet having a first surface and a second surface;

a first electrode comprising an electrically conducting layer on said first surface; and a second electrode comprising an electrically conducting layer on said second surface, wherein said first electrode overlies at least a portion of said second electrode, said portion of said second electrode having a periphery comprising at least a portion of a non-rectangular, irregular polygon, wherein said polygon being a four-sided polygon in which no two sides are parallel to one another.

* * * * *